United States Patent
Li et al.

(10) Patent No.: US 11,153,682 B1
(45) Date of Patent: Oct. 19, 2021

(54) MICRO-SPEAKER AUDIO POWER REPRODUCTION SYSTEM AND METHOD WITH REDUCED ENERGY USE AND THERMAL PROTECTION USING MICRO-SPEAKER ELECTRO-ACOUSTIC RESPONSE AND HUMAN HEARING THRESHOLDS

(71) Applicant: CIRRUS LOGIC INTERNATIONAL SEMICONDUCTOR, LTD., Edinburgh (GB)

(72) Inventors: Ning Li, Cedar Park, TX (US); George E. Hardy, Austin, TX (US); Kaichow Lau, Austin, TX (US); Anthony S. Doy, Los Gatos, CA (US); Ziyan Zou, Austin, TX (US); John L. Melanson, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 17/025,960

(22) Filed: Sep. 18, 2020

(51) Int. Cl.
  *H04R 3/00* (2006.01)
  *H03G 3/30* (2006.01)
  *H04R 29/00* (2006.01)

(52) U.S. Cl.
  CPC ........... *H04R 3/007* (2013.01); *H03G 3/3005* (2013.01); *H04R 29/001* (2013.01)

(58) Field of Classification Search
  USPC ................ 381/55, 56, 58, 98, 102, 104, 106
  See application file for complete search history.

(56) References Cited

U.S. PATENT DOCUMENTS 6,370,254 B1   4/2002 Gore et al.
6,473,662 B2   10/2002 Lubbe et al.
(Continued)

FOREIGN PATENT DOCUMENTS

WO   WO 2008138349 A2   11/2008
WO   WO 2017222562 A1   12/2017
WO   WO 2018069900 A1   4/2018

OTHER PUBLICATIONS

Final Office Action in U.S. Appl. No. 16/255,537 dated Mar. 18, 2020, 16 pages (pp. 1-16 in pdf).
(Continued)

*Primary Examiner* — Yosef K Laekemariam
(74) *Attorney, Agent, or Firm* — Mitch Harris, Atty at Law, LLC; Andrew M. Harris

(57) ABSTRACT

An audio output system for providing an output signal to a micro-speaker provides energy reduction and thermal protection by removing components of an input signal from which the output signal is generated, so that the audio power output system does not expend power reproducing portions of the audio information that would not be perceived by a listener. The micro-speaker has a resonant frequency such that substantial content of the audio information lies below the resonant frequency. A processing subsystem receives the audio information and generates the output signal by filtering the audio information with a response simulating the micro-speaker and an acoustic path to the listener, and comparing the filtered audio information with a frequency-dependent threshold of hearing. The processing subsystem then removes portions of the audio information that have an amplitude below the frequency-dependent threshold of hearing.

26 Claims, 7 Drawing Sheets

(56) References Cited

U.S. PATENT DOCUMENTS

| | | | |
|---|---|---|---|
| 6,771,791 B2 | 8/2004 | Shelley et al. | |
| 6,968,064 B1 | 11/2005 | Ning | |
| 7,092,537 B1 | 8/2006 | Allred et al. | |
| 7,302,062 B2 | 11/2007 | Christoph | |
| 7,447,318 B2 | 11/2008 | Button et al. | |
| 8,170,221 B2 | 5/2012 | Christoph | |
| 8,498,430 B2 | 7/2013 | Hess et al. | |
| 8,521,518 B2 * | 8/2013 | Jung | G10L 19/02 704/200.1 |
| 8,560,320 B2 | 10/2013 | Yu | |
| 8,693,699 B2 | 4/2014 | Fellers et al. | |
| 8,855,322 B2 * | 10/2014 | Ryu | H04R 3/007 381/55 |
| 8,937,537 B2 | 1/2015 | Jaisimha et al. | |
| 9,161,126 B2 | 10/2015 | Su et al. | |
| 9,173,027 B2 | 10/2015 | Su | |
| 9,225,310 B1 | 12/2015 | Lukin | |
| 9,306,525 B2 | 4/2016 | Krishnaswamy et al. | |
| 9,344,828 B2 | 5/2016 | Bongiovi et al. | |
| 9,386,386 B2 | 7/2016 | Risberg et al. | |
| 9,635,459 B2 | 4/2017 | Jung et al. | |
| 9,668,074 B2 | 5/2017 | Drullinger et al. | |
| 9,697,847 B2 | 7/2017 | Dehghani et al. | |
| 9,704,497 B2 | 7/2017 | Porter et al. | |
| 9,729,951 B2 | 8/2017 | Wolf et al. | |
| 9,735,746 B2 | 8/2017 | Christoph | |
| 9,762,198 B2 | 9/2017 | Seefeldt | |
| 9,807,502 B1 | 10/2017 | Hatab et al. | |
| 9,877,107 B2 | 1/2018 | Painter et al. | |
| 10,356,521 B2 | 7/2019 | Lawrence et al. | |
| 10,559,316 B2 | 2/2020 | Cassidy et al. | |
| 2012/0051558 A1 | 3/2012 | Kim et al. | |
| 2013/0329894 A1 * | 12/2013 | Krishnaswamy | H03G 11/00 381/55 |
| 2019/0230438 A1 | 7/2019 | Hatab et al. | |

OTHER PUBLICATIONS

Painter, et al., "Perceptual Coding of Digital Audio", Proceedings of the IEEE, vol. 88, issue 4, Apr. 2000, 66 pages (pp. 1-66 in pdf), IEEE, US.

Chen, et al., "A 2.5 Tablet Speaker Delivering 3.2W Pseudo High Power by Psychoacoustic Model Based Adaptve Power Management System", IEEE Asian Solid-State Circuits Conf., Nov. 10-12, 2014, pp. 221-224, IEEE, TW.

Chiu, "Efficient Audio Signal Processing for Embedded Systems", Thesis Presented to Academic Faculty, Georgia Institute of Technology, Aug. 2012, 124 pages (pp. 1-124 in pdf), US.

\* cited by examiner

MICRO-SPEAKER AUDIO POWER REPRODUCTION SYSTEM AND METHOD WITH REDUCED ENERGY USE AND THERMAL PROTECTION USING MICRO-SPEAKER ELECTRO-ACOUSTIC RESPONSE AND HUMAN HEARING THRESHOLDS

BACKGROUND

1. Field of Disclosure

The field of representative embodiments of this disclosure relates to audio power reproduction methods, circuits and systems that use knowledge of micro-speaker response to conserve energy expended by the transducer and optionally provide thermal protection thereby.

2. Background

Voice coil-based acoustic output transducers, such as micro speakers that may be included in personal devices, typically contain a single voice coil that is energized by an amplifier or pulse-width modulator output. The voice coil moves due to an electromotive force provided between the voice coil and a permanent magnetic field provided by a magnet and has an electromechanical response dictated by the mechanical structure of the transducer, that in turn, determines the electro-acoustic response of the transducer. Typically, electrically-induced failure of a micro-speaker is due to either overcurrent through the voice coil resulting in immediate catastrophic failure, or thermal failure caused by overheating of the voice coil, which can melt the voice coil conductor or insulation, demagnetize the permanent magnet of the transducer, or cause other overheat failures such as melting of a plastic frame.

Typical thermal protection techniques for use in protecting speakers involve either absolute and conservative limits on voice coil excursion and power dissipation, such as a thermal protection switch mounted on the frame of a loud-speaker. More sophisticated techniques applicable to all speakers including micro-speakers use a feedback system in which a temperature of the voice coil is estimated from a calculation of voice coil resistance based on measurements of voltage and current at the terminals of the transducer. The power output circuit can either be shut down or the amplitude of the power output signal reduced in order to prevent transducer failure.

Therefore, it is advantageous to provide techniques for reducing or preventing thermal overload in micro-speakers.

SUMMARY

Thermal protection and energy conservation may be achieved in audio power reproduction systems/circuits and their methods of operation.

The methods, systems and circuits receive audio information from an input for an audio source and provide current to a micro-speaker according to the audio information using an audio power output circuit. The micro-speaker has a resonant frequency such that substantial content of the audio information lies below the resonant frequency. A processing subsystem receives the audio information and generates an output signal that is provided to an input of the audio power output circuit. The processing subsystem filters the audio information with an estimated response simulating a frequency response of the micro-speaker and an acoustic path from the micro-speaker to a listener, and compares the filtered audio information with a frequency-dependent threshold of hearing. The processing subsystem then removes portions of the audio information that have an amplitude below the frequency-dependent threshold of hearing, so that the audio power output circuit does not expend power reproducing portions of the audio information that would not be perceived by the listener.

The summary above is provided for brief explanation and does not restrict the scope of the Claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

DESCRIPTION OF ILLUSTRATIVE EMBODIMENT

The present disclosure encompasses methods, systems and circuits that provide audio output signals to drive micro-speakers based on an audio input signal. The techniques illustrated herein provide energy reduction and thermal protection by removing components of the input signal from which the output signal is generated, so that the audio power output system does not expend power and generate heat reproducing portions of the audio information that would not be perceived by a listener. The micro-speaker has a resonant frequency such that substantial content of the audio information lies below the resonant frequency. A processing subsystem receives the audio information and generates the output signal by filtering the audio information with an estimated response simulating a frequency response of the micro-speaker and an acoustic path from the micro-speaker to the listener, and comparing the filtered audio information with a frequency-dependent threshold of hearing. The processing subsystem then removes portions of the audio information that have an amplitude below the frequency-dependent threshold of hearing.

Figure 1A:
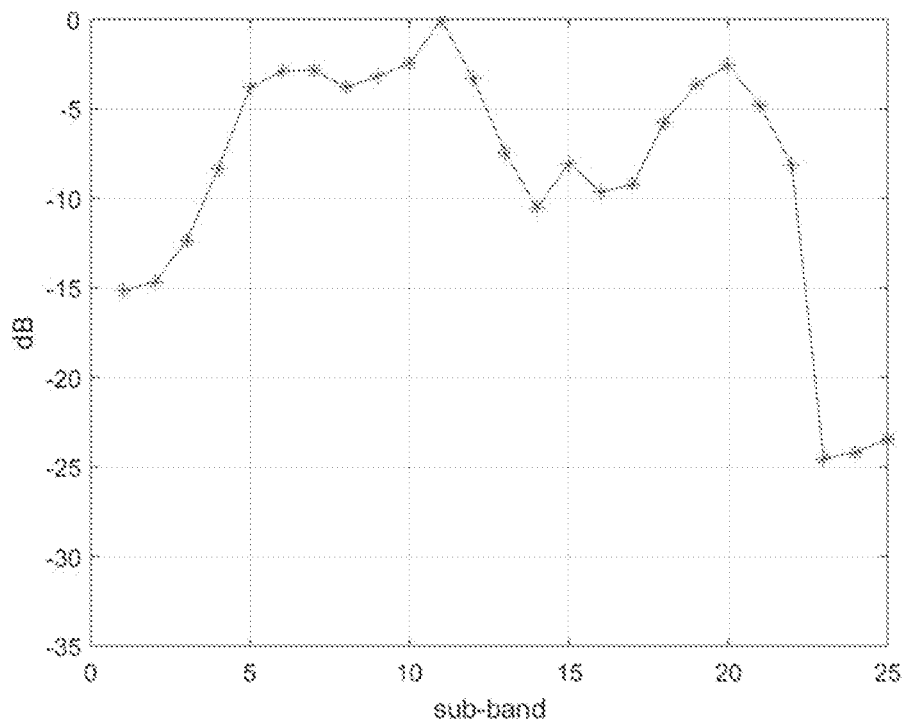
FIG. 1A and FIG. 1B are example graphs showing the electro-acoustic response of two different micro-speakers as may be driven by circuits and systems in accordance with embodiments of the disclosure, expressed as relative amplitude (dB) vs. Bark sub-band.
Figure 1B:
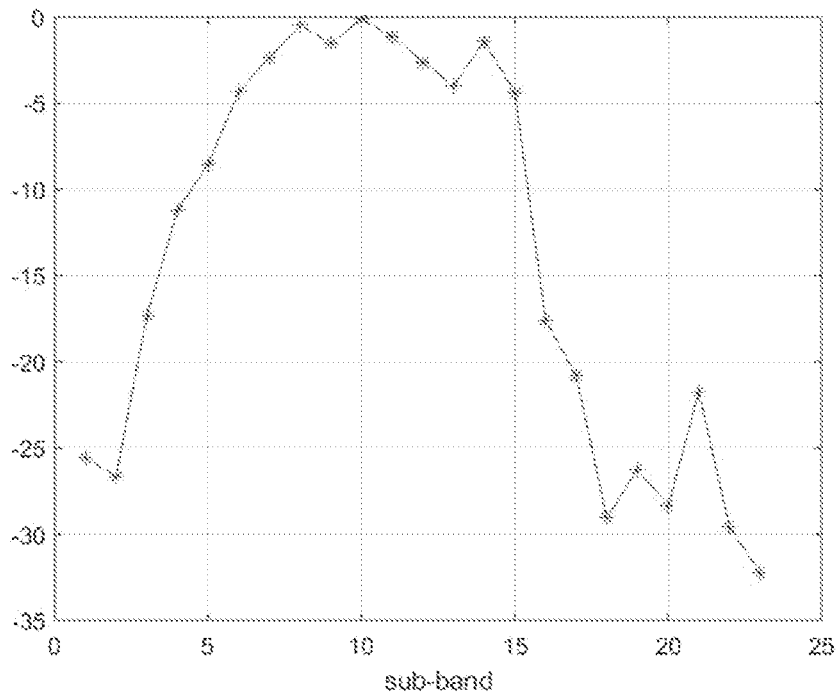
Figure 2:
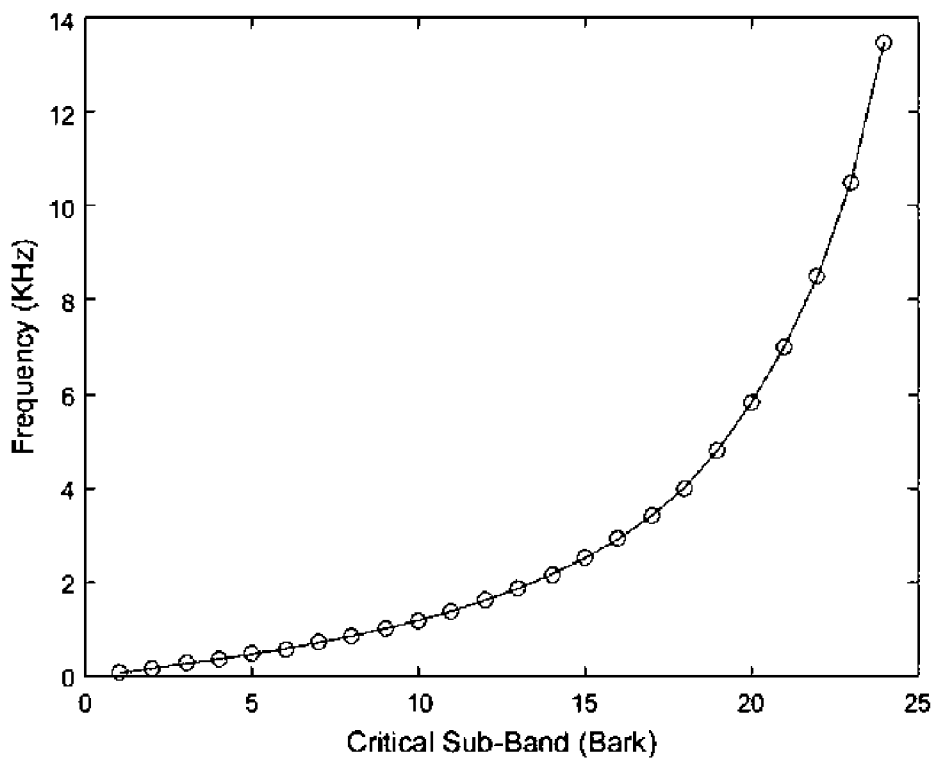
FIG. 2 is an example graph showing the frequencies of the Bark sub-bands of FIG. 1A and FIG. 1B.
Figure 3:
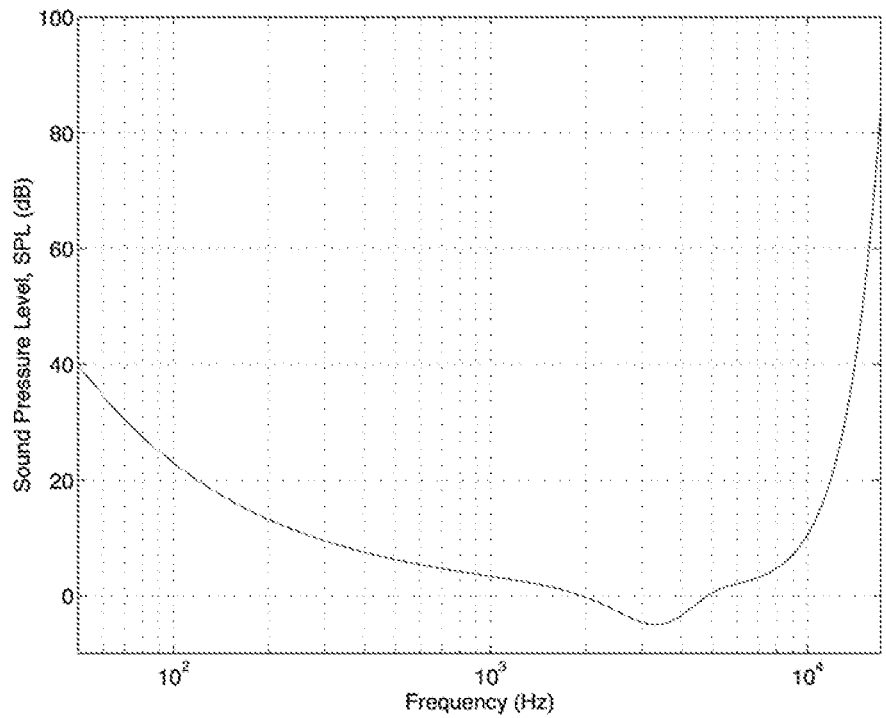
FIG. 3 is an example graph showing a threshold of human hearing vs. frequency, as may be used in accordance with embodiments of the disclosure described below.

Referring now to FIG. 1A and FIG. 1B, graphs of the relative amplitude of the electroacoustic response of two different micro-speakers is shown, as dependent on the Bark frequency sub-band. In the response of FIG. 1A, audio content in and below the Bark sub-band 3 (below 300 Hz), i.e. below the resonant frequency of approximately 450 Hz, is attenuated by more than 10 dB and thus is unlikely to contribute much to the listener's perception. Audio content in and above Bark sub-band 23 (above 9500 Hz) is attenuated by more than 20 dB and also is unlikely to contribute to the listener's perception. FIG. 2 shows the relationship between center frequency of each Bark sub-band and the sub-band number. Grouping the frequencies by Bark sub-band instead of absolute frequency provides perceptually equal weighting of each sub-band, or critical band, in which human perception of audio energy is approximately of equal importance. By knowing the response of the micro-speaker, it is possible to compute, based upon also knowing the perceptual limit of the average human ear vs. frequency, which is shown in FIG. 3, which corresponds to the Fletcher-Munson curve of least amplitude—the threshold of audibility vs. frequency. From the threshold of audibility and the electroacoustic response of the micro-speaker, a threshold signal power level can be determined below which any energy delivered to the micro-speaker is wasted, either by being converted almost entirely to heat due to lack of micro-speaker mechanical response, or by not contributing significantly to the perceived sound generated by the micro-speaker. FIG. 1B shows the response of another micro-speaker, for which audio content above Bark sub-band 15 (above 2700 Hz) and below Bark sub-band 5 (below 400 Hz), i.e. below the resonant frequency of approximately 650 Hz, will not significantly contribute to the perceived sound. The dramatic differences between the responses illustrated in FIG. 1A and FIG. 1B demonstrate the importance of using the response of the micro-speaker in determining what energy may be removed from the input signal content while generating an output signal for which perception is essentially unaffected by the removal of energy. The following illustrated embodiments use the micro-speaker response in combination with information about the threshold of human hearing and the acoustic environment of the micro-speaker, i.e., the acoustic path from the micro-speaker to the ear of the listener, in order to compute gain values to be applied to one or more frequency bands of audio input signal content. The resulting total electro-acoustic response $H_{SPKR}$ and the thresholds of human hearing in each band is used to transform an input signal into an output signal for driving the micro-speaker that reduces waste of energy reproducing (or attempting the reproduction of) acoustic signal that would not be perceived by the listener.

Figure 4:
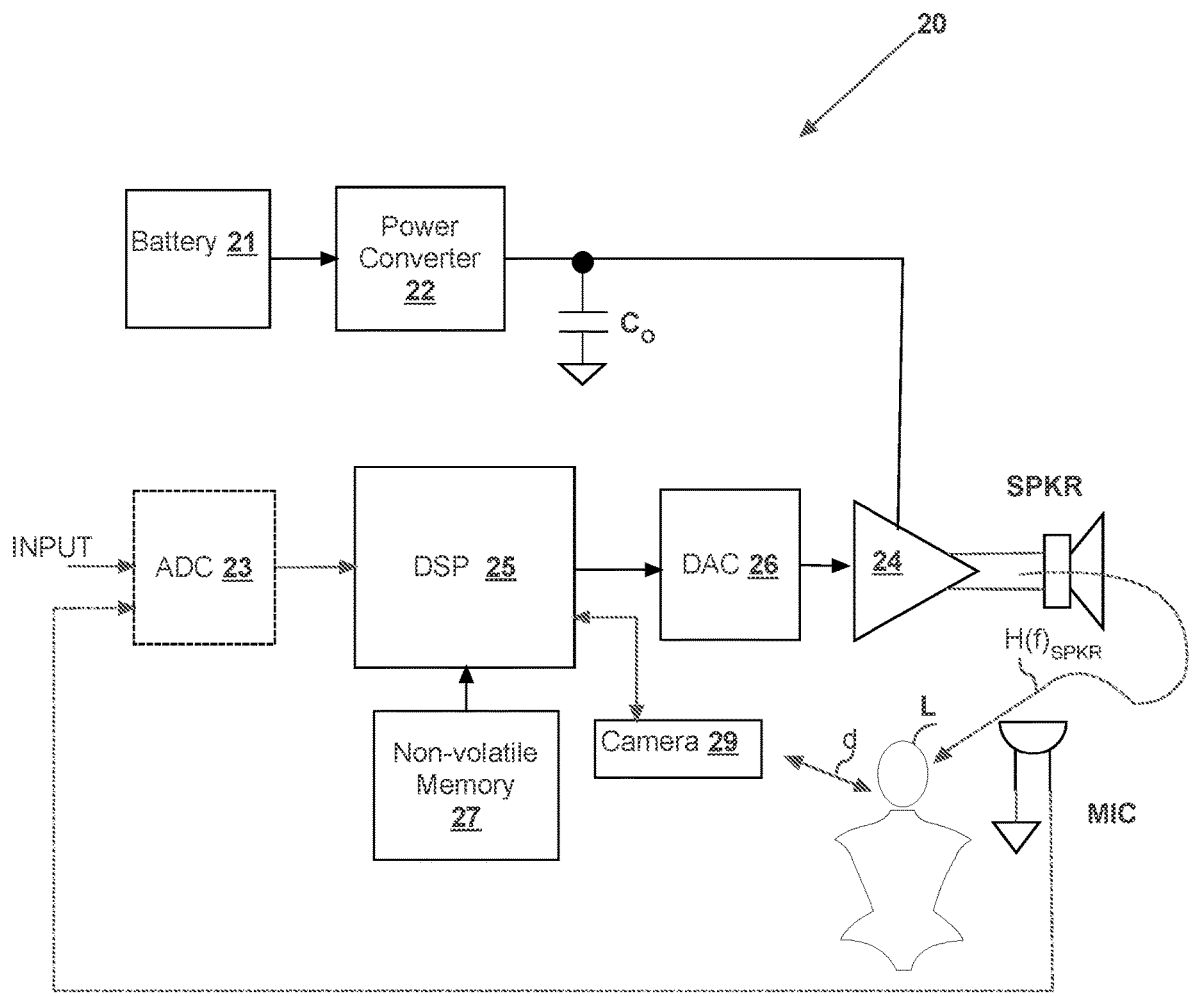
FIG. 4 is an example block diagram of a digital signal processing system that may be used to implement the systems of FIGS. 2-4, in accordance with embodiments of the disclosure.

Referring now to FIG. 4, a generalized digital signal processing system 20 is shown, which may be used to implement the techniques of the present disclosure as further illustrated in FIGS. 4-8 as described below. A digital signal processor (DSP) 25 (or a suitable general-purpose processor such as a microcontroller core) executes program instructions stored in a non-volatile memory 27 and that form a computer-program product in accordance with the present disclosure. DSP 25 receives samples of a signal from an input or from an optional analog-to-digital converter (ADC) 23 that receives an analog signal at an INPUT. A battery 21 supplies energy to a power converter 22 and output filter capacitor $C_O$, that, in turn, supply energy to a power output stage 24 that drives a micro-speaker SPKR. Power output stage 24 may be an analog power amplifier, a switched-power circuit such as a PWM (pulse-width modulated) or Class-D output circuit, or other output circuit type suitable for supplying power to a micro-speaker. A digital-to-analog converter (DAC) 26 receives output signal values generated from the input signal by DPS 25 according to one or more of the embodiments described below, and supplies the input signal to power output stage 24. In one example embodiment, a microphone MIC is provided to measure the electroacoustic response $H(f)_{SPKR}$ of micro-speaker SPKR including the acoustic environment of micro-speaker and the acoustic path from micro-speaker SPKR to an ear of a listener L, presuming that microphone MIC is positioned near listener L. Measurement is performed by DSP 25 generating a swept tone, chirp or noise that is provided to DAC 26 and reproduced by micro-speaker SPKR, and then DSP 25 receiving a response from microphone MIC via ADC 23. DSP 25 may then determine values of the acoustic response of micro-speaker SPKR for each frequency band of interest. The values of the acoustic response of micro-speaker SPKR including the acoustic path from the micro-speaker to listener L may then be stored in non-volatile memory 27 for subsequent use in determining gain coefficients as described below, or the gain coefficients may be determined directly during measurement and stored for later use, without storing the response measurement values. In another example embodiment, a distance d from micro-speaker SPKR is estimated and used to compute the portion of the electro-acoustic response H(f) on the acoustic path from micro-speaker SPKR to listener L, which may be performed by detecting an acoustic signature, e.g., a reverberant portion of an impulse response of speech of listener L received by microphone MIC or an acoustic signature of background noise received by microphone MIC. In yet another example embodiment, distance d may be determined using a front-facing camera 29 of a mobile telephone or other such device near listener L using the relative size of an image of listener L in the view of camera 29. Since camera 29 is in the same housing as micro-speaker SPKR, distance d provides a measure of the distance from listener L to micro-speaker SPKR. In general, the response of micro-speaker SPKR, including the acoustic path to listener L may be measured as described above in real-time or offline conditions, may be determined a priori and stored in non-volatile memory 27, or may be determined from calculations or look-up tables using some other metric such as ambient temperature or on-line coil resistance measurements.

Figure 5:
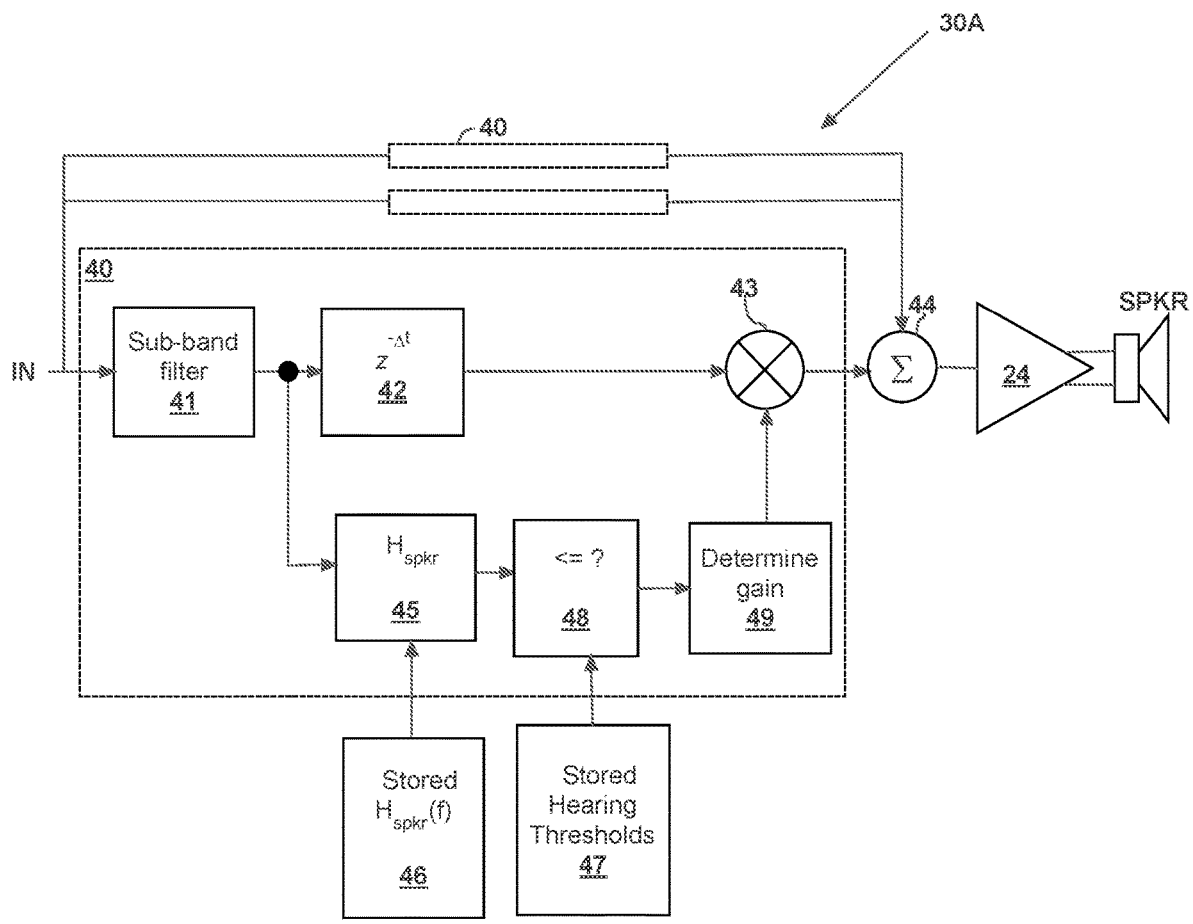
FIG. 5 is an example block diagram illustrating a system in accordance with an embodiment of the disclosure.

Referring to FIG. 5, a block diagram of an example system 30A is shown, in accordance with an embodiment of the disclosure. In example system 30A, multiple sub-band channels 40 individually operate on the portion of an input signal IN corresponding to a frequency band, which may be composed of one or more Bark sub-bands per channel 40, or may be assigned to other arbitrary frequency ranges. In each of channels 40, a sub-band filter extracts the pass-band corresponding to the channel from input signal IN. Other than the particular frequency range assigned to channels 40 their structure is identical. The input to power output stage 24 is provided a summer 44 which sums the outputs of channels 40. The outputs of channels 40 are provided by the output of the corresponding sub-band filter 41 delayed by a compensating delay 42 and adjusted by a gain factor applied by a multiplier 43 as supplied by a gain determination block 49. Compensating delay 42 delays the output of sub-band filter 41 by an amount of time taken in computation of the output of gain determination block 49, so that the gain value applied by multiplier 43 is synchronized with the audio information at the output of compensation delay 42. To produce the gain value, the output of sub-band filter 41 is transformed by the previously measured or known micro-speaker response $H_{SPKR}(f)$ 46 by a response application block 45 that may simply multiply the output of sub-band filter 41 by an average value of $H_{SPKR}(f)$ for the sub-band, or which may be a convolver or fast Fourier transform (FFT) computation block that applies a model of $H_{SPKR}(f)$ across the sub-band. Estimated response $H_{SPKR}(f)$ includes the response of the micro-speaker along with its acoustic environment up to the location of the listener, so that the volume of air backing an-unsealed micro-speaker and the distance to and acoustic environment of the listener are included, in order to properly determine which energy can be removed from, or left out of, the electrical signal provided to the micro-speaker. The output of response application block 45 represents the actual acoustic output of micro-speaker SPKR to the portion of input signal IN within the corresponding sub-band. Next, a comparison block 48 determines whether the acoustic output energy for the sub-band is less than or equal to a human hearing threshold for the sub-band that is retrieved from a storage 47. Gain determination block 49 computes the gain to be applied to the sub-band from a result of the comparison, which may be binary, i.e., a direct result of the comparison provided by comparison block 48, or may be scaled based upon how far the acoustic energy falls below the human hearing threshold.

For each sub-band in example system 30A, as well as other embodiments of the disclosure described herein, the gain $G_i$ to be applied to the filtered input signal, i.e., the portion of the input signal falling within a given sub-band i, may be computed as:

$$G_i = \max\left(G_{limit}, \min\left(1, \frac{P_i}{ATH_i}\right)\right),$$

where $P_i$ is the signal power in the sub-band, $ATH_i$ is the absolute threshold of hearing in the sub-band and $G_{limit}$ is the maximum gain that may be applied to the portion of the signal in the sub-band. As long as the signal power in the sub-band $P_i$ is greater than the absolute threshold of hearing in the sub-band $ATH_i$, unity gain is applied to the sub-band's portion of the input signal. Once signal power in the sub-band $P_i$ is less than the absolute threshold of hearing in the sub-band $ATH_i$, the attenuation increases as the ratio of $P_i$ to $ATH_i$, so that the attenuation becomes more aggressive as the amount of signal within the sub-band falls further below hearing threshold $ATH_i$.

Figure 6:
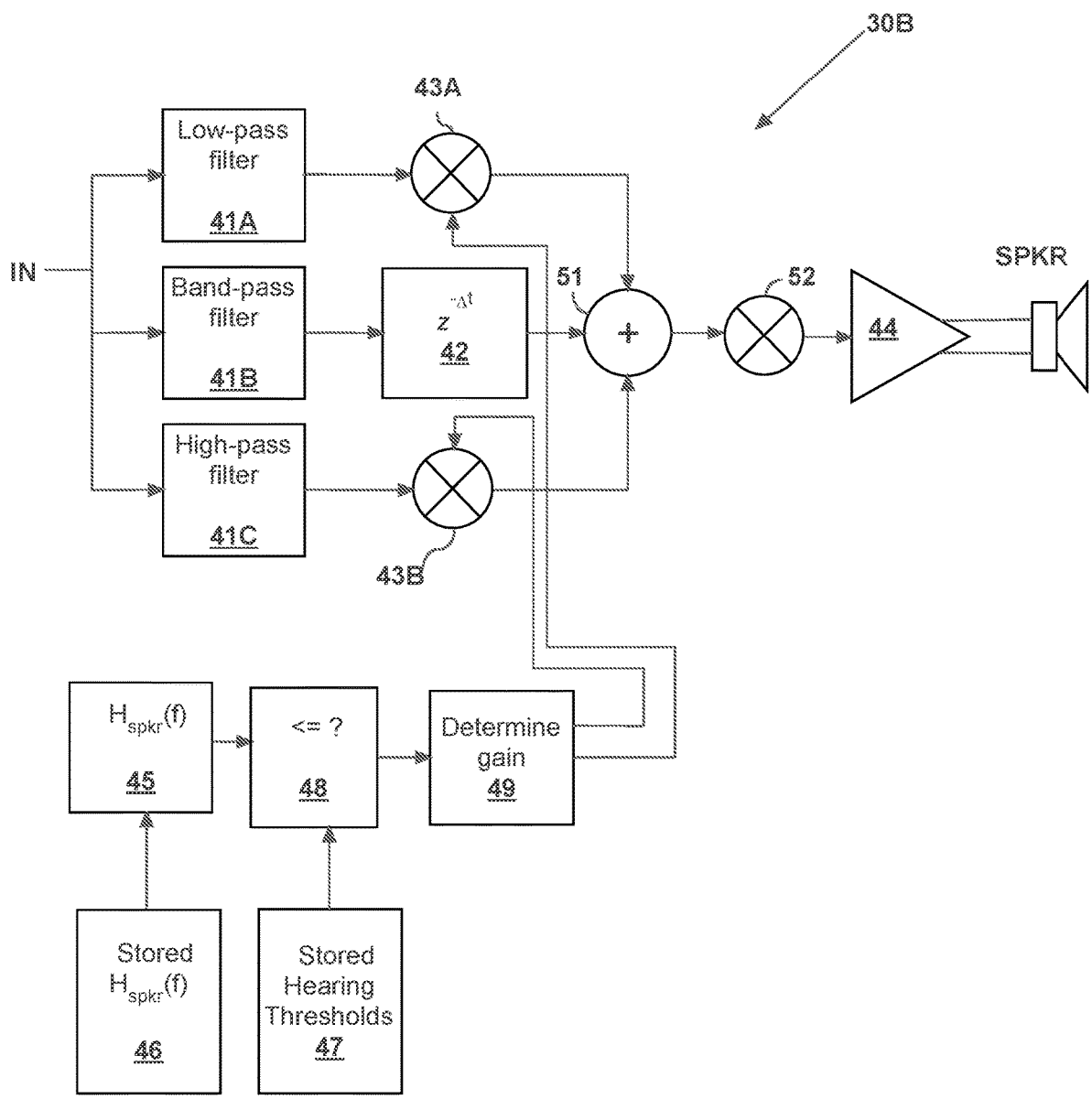
FIG. 6 is an example block diagram illustrating a system in accordance with another embodiment of the disclosure.

Referring to FIG. 6, a block diagram of an example system 30B is shown, in accordance with an embodiment of the disclosure. Example system 30B has some similarity to example system 30A of FIG. 5, so only differences between the two systems will be described below. In example system 30B, instead of multiple sub-band channels, a single gain adjusting channel is used for the highest frequencies and another gain-adjusting channel is used for the lowest frequencies, leaving the signal content in the mid-band alone. A low-pass filter 41A extracts the lowest-frequency components of input signal IN and a high-pass filter 41C extracts the highest-frequency components of input signal IN. A pair of multipliers 43A, 43B apply gain values to the low-frequency and high-frequency bands, respectively, and while multiple sub-bands could be included for one or both of the low-frequency and high-frequency bands, in the simplest configuration, the low-frequency and high-frequency bands are treated as individual bands with the absolute hearing threshold and micro-speaker response $H_{spkr}$ (f) averaged over each respective bands in order to determine the gains applied by multipliers 43A, 43B.

Figure 7:
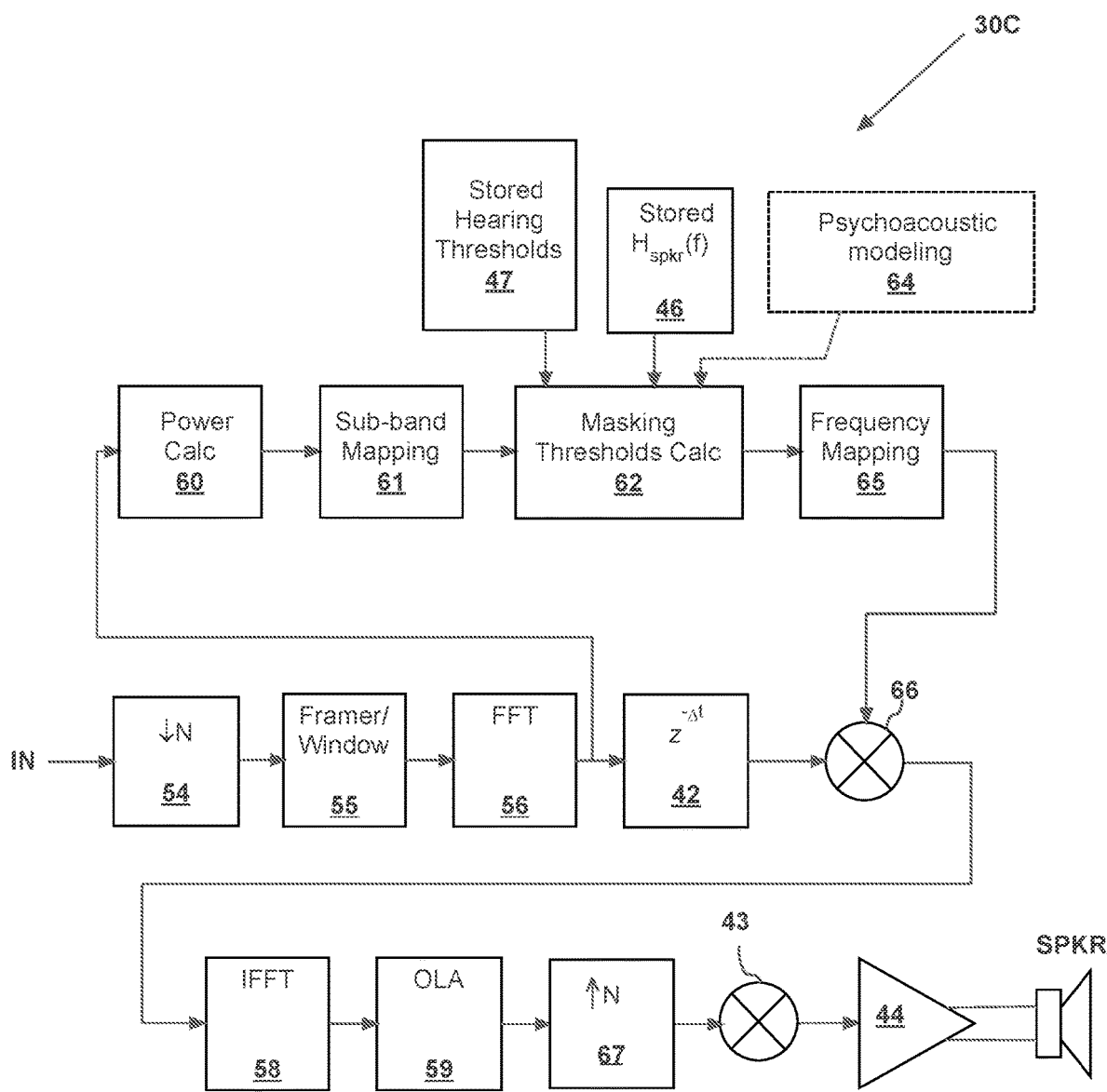
FIG. 7 is an example block diagram illustrating a system in accordance with another embodiment of the disclosure.

Referring to FIG. 7, a block diagram of another example system 30C is shown, in accordance with an embodiment of the disclosure. Example system 30C has some similarity to example system 30A of FIG. 5, so only differences between the two systems will be described below. In example system 30C, digital input samples provided by input IN are decimated by a factor of N by a decimation block 54 and a framing block 55 groups the samples and applies any windowing function. The input signal is analyzed by a FFT block 56 to provide a set of FFT coefficients representing the signal corresponding to input values DIN. A power calculation block 60 computes the power for each FFT component and a sub-band mapping block 61 maps the FFT components to the sub-bands of interest. A masking threshold calculation block 62 determines the gains to apply to the sub-bands as described above from the stored $H_{SPKR}(f)$ 46 and stored hearing thresholds 47. Optionally, adjustments by coefficients of a psychoacoustic model for the sub-bands may be additionally applied to change the gain values for each group of FFT components corresponding to the sub-bands. A frequency mapping block 65 determines the gains to apply to each of the FFT components, according to which sub-band the components belong, and a multiplier 66 applies the gain values to the components. The components are then processed by an inverse FFT (IFFT) block 58 and an overlap add (OLA) block 59 to re-synthesize the input signal represented by input values DIN as modified by the gains applied according to speaker response and human hearing thresholds. The output of OLA block 59 is interpolated upward by a factor of N by an interpolator 67 and provided to output gain control 43, which provides the input to power output stage 44, which then delivers the power output signal to micro-speaker SPKR.

Figure 8:
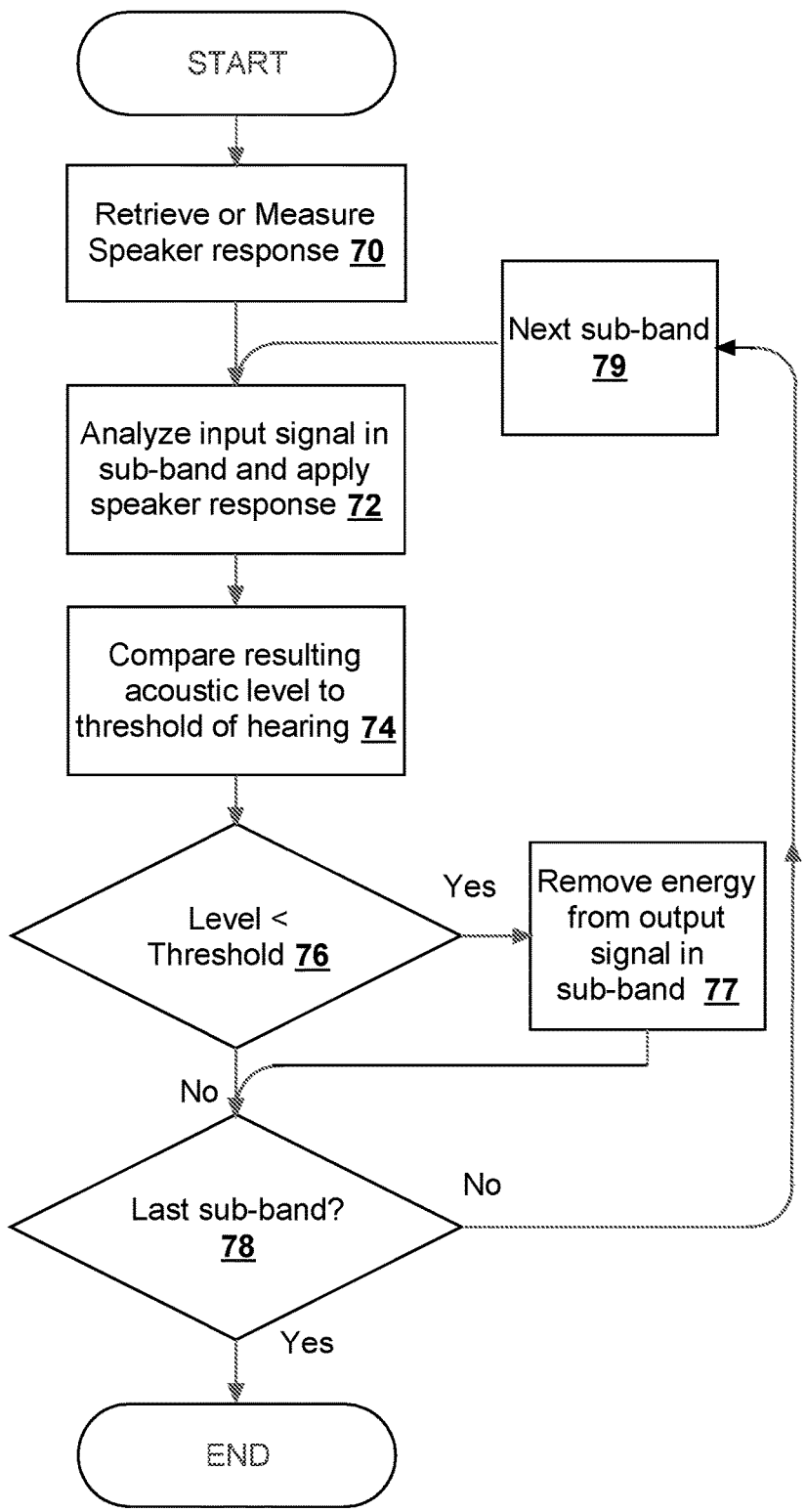
FIG. 8 is an example flowchart illustrating a method in accordance with an embodiment of the disclosure.

Referring to FIG. 8, a flowchart of an example method is shown, in accordance with an embodiment of the disclosure. The electroacoustic response of the micro-speaker is retrieved or measured (step 70). The input signal is analyzed in the sub-band, and the speaker response is applied (step 72). The result for the sub-band is compared to the threshold of hearing (step 74). If the sub-band signal level is less than the threshold (decision 76), then energy in the sub-band is removed from the output signal (step 77). Until the last sub-band is processed (decision 78), the process of steps 72-78 is repeated for the next sub-band (step 79).

As mentioned above portions or all of the disclosed process may be carried out by the execution of a collection of program instructions forming a computer program product stored on a non-volatile memory, but that also exist outside of the non-volatile memory in tangible forms of storage forming a computer-readable storage medium. The computer-readable storage medium may be, for example, but is not limited to, an electronic storage device, a magnetic storage device, an optical storage device, an electromagnetic storage device, a semiconductor storage device, or any suitable combination of the foregoing. Specific examples of the computer-readable storage medium include the following: a hard disk, semiconductor volatile and non-volatile memory devices, a portable compact disc read-only memory (CD-ROM) or a digital versatile disk (DVD), a memory stick, a floppy disk or other suitable storage device not specifically enumerated. A computer-readable storage medium, as used herein, is not to be construed as being transitory signals, such as transmission line or radio waves or electrical signals transmitted through a wire. It is understood that blocks of the block diagrams described above may be implemented by computer-readable program instructions.

These computer readable program instructions may also be stored in other storage forms as mentioned above and may be downloaded into a non-volatile memory for execution therefrom. However, the collection of instructions stored on media other than the non-volatile memory described above also form a computer program product that is an article of manufacture including instructions which implement aspects of the functions/actions specified in the block diagram block or blocks, as well as method steps described above.

In summary, this disclosure shows and describes circuits, systems and methods that provide audio power output signals to one or more micro-speakers. The circuits and systems include an input for an audio source providing audio information, an audio power output circuit for providing current to a micro-speaker according to the audio information. The micro-speaker has a resonant frequency such that substantial content of the audio information lies below the resonant frequency. The circuits and systems also include a processing subsystem that receives the audio information and generates an output signal provided to an input of the audio power output circuit. The processing subsystem filters the audio information with an estimated response simulating a frequency response of the micro-speaker and an acoustic path from the micro-speaker to a listener, and compares the filtered audio information with a frequency-dependent threshold of hearing. The processing subsystem then removes portions of the audio information that have an amplitude below the frequency-dependent threshold of hearing, so that the audio power output circuit does not expend power reproducing portions of the audio information that would not be perceived by the listener. The processing subsystem may be implemented by a digital signal processor or other processor such as a general-purpose processor coupled to a memory that stores program instructions for carrying out the operations described above. The method is a method of operation of the system and circuits.

The processing subsystem may compute one or more frequency-dependent gain values from a result of comparing the filtered audio information with a frequency-dependent threshold of hearing, and may apply the one or more frequency-dependent gain values to the audio information to remove the portions of the audio information that have an amplitude below the frequency-dependent threshold of hearing. The processing subsystem may split the audio information into one or more sub-bands prior to comparing the audio information with the frequency-dependent threshold of hearing, and the processing subsystem may filter the audio information with the estimated response within at least one of the sub-bands, and may compare the filtered audio information for the at least one sub-band with a frequency-dependent threshold of hearing for the at least one sub-band.

The processing subsystem may split the audio information into three sub-bands prior to comparing the audio information with the frequency-dependent threshold of hearing. The three sub-bands may be a low-frequency sub-band, a mid-frequency sub-band and a high-frequency sub-band, and the processing subsystem may filter the audio information with the estimated response within the high-frequency and low-frequency sub-bands, and compare the filtered audio information for the high-frequency and low-frequency sub-bands with a frequency-dependent threshold of hearing for the high-frequency and low-frequency sub-bands. The processing subsystem may remove the portions of the audio information only from the high-frequency and low-frequency sub-bands, while leaving the audio information in the mid frequency band unchanged, so that distortion of the audio information due to the removal of the audio information that has an amplitude below the frequency-dependent threshold of hearing is prevented in the mid-frequency band. The processing subsystem may split the audio information into at least two sub-bands prior to comparing the audio information with the frequency-dependent threshold of hearing. The at least two sub-bands may include a first sub-band for which removal of audio information is performed and one or more second sub-bands for which removal of audio information is not performed, so that distortion of the audio information due to the removal of the audio information that has an amplitude below the frequency-dependent threshold of hearing is prevented in the one or more second sub-bands. The processing subsystem may determine the estimated response, or may measure the estimated response using at least one microphone for generating at least one microphone signal that is provided to the processing subsystem. The processing system may measure the response by generating a test signal that is reproduced by the audio power output circuit and receiving an acoustic response of the micro-speaker to the test signal from the at least one microphone signal. The processing subsystem may determine one or more parameters of the micro-speaker by measuring the current provided to the micro-speaker, and may compute the estimated response from the one or more parameters of the micro-speaker. The system may include a microphone for generating a microphone signal that is provided to the processing sub-system, and the processing system may measure the estimated response by observing speech or background noise in the at least one microphone signal. The processing sub-system may determine a portion of the estimated response by determining a distance to the listener. The processing sub-system may retrieve a portion of the estimated response from a stored model of a nominal acoustic response for a device in which the micro-speaker is incorporated.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied in systems with other types of transducers, such as loudspeakers.

What is claimed is:

1. An audio power reproduction system, comprising:
an input for an audio source providing audio information;
an audio power output circuit for providing current to a micro-speaker according to the audio information, wherein the micro-speaker has a resonant frequency such that substantial content of the audio information lies below the resonant frequency; and
a processing subsystem that receives the audio information and generates an output signal provided to an input of the audio power output circuit, wherein the processing subsystem filters the audio information with an estimated response simulating a frequency response of the micro-speaker and an acoustic path from the micro-speaker to a listener, and compares the filtered audio information with a frequency-dependent threshold of hearing, and removes portions of the audio information that have an amplitude below the frequency-dependent threshold of hearing, whereby the audio power output circuit does not expend power reproducing portions of the audio information that would not be perceived by the listener.

2. The audio power reproduction system of claim 1, wherein the processing subsystem computes one or more frequency-dependent gain values from a result of comparing the filtered audio information with a frequency-dependent threshold of hearing, and applies the one or more frequency-dependent gain values to the audio information to remove the portions of the audio information that have an amplitude below the frequency-dependent threshold of hearing.

3. The audio power reproduction system of claim 1, wherein the processing subsystem splits the audio information into one or more sub-bands prior to comparing the audio information with the frequency-dependent threshold of hearing, wherein the processing subsystem filters the audio information with the estimated response within at least one of the sub-bands, and wherein the processing subsystem compares the filtered audio information for the at least one sub-band with a frequency-dependent threshold of hearing for the at least one sub-band.

4. The audio power reproduction system of claim 3, wherein the processing subsystem splits the audio information into three sub-bands prior to comparing the audio information with the frequency-dependent threshold of hearing, wherein the three sub-bands are a low-frequency sub-band, a mid-frequency sub-band and a high-frequency sub-band, wherein the processing subsystem filters the audio information with the estimated response, and wherein the processing subsystem compares the filtered audio information for the high-frequency and low-frequency sub-bands with a frequency-dependent threshold of hearing for the high-frequency and low-frequency sub-bands and removes the portions of the audio information only from the high-frequency and low-frequency sub-bands, while leaving the audio information in the mid frequency band unchanged, whereby distortion of the audio information due to the removal of the audio information that has an amplitude below the frequency-dependent threshold of hearing is prevented in the mid-frequency band.

5. The audio power reproduction system of claim 3, wherein the processing subsystem splits the audio information into at least two sub-bands prior to comparing the audio information with the frequency-dependent threshold of hearing, wherein the at least two sub-bands include a first sub-band for which removal of audio information is performed and one or more second sub-bands for which removal of audio information is not performed, whereby distortion of the audio information due to the removal of the audio information that has an amplitude below the frequency-dependent threshold of hearing is prevented in the one or more second sub-bands.

6. The audio power reproduction system of claim 3, wherein the processing subsystem further determines the estimated response.

7. The audio power reproduction system of claim 6, further comprising at least one microphone for generating at least one microphone signal that is provided to the processing subsystem, wherein the processing system further measures the estimated response by generating a test signal that is reproduced by the audio power output circuit and receiving an acoustic response of the micro-speaker and the acoustic path to the test signal from the at least one microphone signal.

8. The audio power reproduction system of claim 6, wherein the processing subsystem determines one or more parameters of the micro-speaker by measuring the current provided to the micro-speaker, and wherein the processing system further computes the response simulating a frequency response of the micro-speaker from the one or more parameters of the micro-speaker.

9. The audio power reproduction system of claim 6, further comprising at least one microphone for generating at least one microphone signal that is provided to the processing sub-system, wherein the processing system further measures the estimated response by observing speech or background noise in the at least one microphone signal.

10. The audio power reproduction system of claim 6, wherein the processing sub-system determines a portion of the estimated response by determining a distance to the listener.

11. The audio power reproduction system of claim 1, wherein the processing sub-system retrieves a portion of the estimated response from a stored model of a nominal acoustic response for a device in which the micro-speaker is incorporated.

12. A method of reducing power consumed in providing an acoustic output from a micro-speaker, the method comprising:
receiving audio information;
filtering the audio information with an estimated response simulating a frequency response of the micro-speaker and an acoustic path from the micro-speaker to a listener;
comparing the filtered audio information with a frequency-dependent threshold of hearing;
removing portions of the audio information that have an amplitude below the frequency-dependent threshold of hearing; and
providing current to the micro-speaker from an audio power output circuit according to a result of the removing, whereby the audio power output circuit does not expend power reproducing portions of the audio information that would not be perceived by the listener.

13. The method of claim 12, wherein the filtering comprises computing one or more frequency-dependent gain values from a result of the comparing the filtered audio information with a frequency-dependent threshold of hearing, and wherein the removing comprises applying the one or more frequency-dependent gain values to the audio information to remove the portions of the audio information that have an amplitude below the frequency-dependent threshold of hearing.

14. The method of claim 12, further comprising splitting the audio information into one or more sub-bands prior to the comparing of the audio information with the frequency-dependent threshold of hearing, wherein the processing subsystem filters the audio information with the estimated response within at least one of the sub-bands, and wherein the comparing compares the filtered audio information for the at least one sub-band with a frequency-dependent threshold of hearing for the at least one sub-band.

15. The method of claim 14, wherein the splitting splits the audio information into three sub-bands prior to filtering the audio information with the frequency-dependent threshold of hearing, wherein the three sub-bands are a low-frequency sub-band, a mid-frequency sub-band and a high-frequency sub-band, wherein the filtering filters the audio information with the estimated response within the high-frequency and low-frequency sub-bands, wherein the comparing compares the filtered audio information for the high-frequency and low-frequency sub-bands with a frequency-dependent threshold of hearing for the high-frequency and low-frequency sub-bands, and wherein the removing removes the portions of the audio information only from the high-frequency and low-frequency sub-bands, while leaving the audio information in the mid frequency band unchanged, whereby distortion of the audio information due to the removal of the audio information that has an amplitude below the frequency-dependent threshold of hearing is prevented in the mid-frequency band.

16. The method of claim 14, wherein the splitting splits the audio information into at least two sub-bands prior to filtering the audio information with the frequency-dependent threshold of hearing, wherein the at least two sub-bands include a first sub-band for which removal of audio information is performed and one or more second sub-bands for which removal of audio information is not performed, whereby distortion of the audio information due to the removal of the audio information that has an amplitude below the frequency-dependent threshold of hearing is prevented in the one or more second sub-bands.

17. The method of claim 14, further comprising determining the estimated response.

18. The method of claim 17, further comprising:
receiving a microphone signal from at least one microphone; and
measuring the estimated response by generating a test signal that is reproduced by the audio power output circuit and receiving an acoustic response of the micro-speaker to the test signal from the at least one microphone signal.

19. The method of claim 17, further comprising:
determining one or more parameters of the micro-speaker by measuring the current provided to the micro-speaker; and
computing the estimated response from the one or more parameters of the micro-speaker.

20. The method of claim 17, further comprising:
receiving a microphone signal from at least one microphone; and
measuring the estimated response by observing speech or background noise in the at least one microphone signal.

21. The method of claim 17, wherein the processing sub-system determines a portion of the estimated response by determining a distance to the listener.

22. The method of claim 12, further comprising retrieving a portion of the estimated response from a stored model of a nominal acoustic response for a device in which the micro-speaker is incorporated.

23. A computer program product comprising a computer-readable storage device that is not a signal or wave, the computer-readable storage medium storing program instructions for reducing power consumed in providing an acoustic output from a micro-speaker, the program instructions comprising:
program instructions for receiving audio information;
program instructions for filtering the audio information with a response simulating a frequency response of the micro-speaker and an acoustic path from the micro-speaker to a listener;
program instructions for comparing the filtered audio information with a frequency-dependent threshold of hearing;
program instructions for removing portions of the audio information that have an amplitude below the frequency-dependent threshold of hearing; and
program instructions for generating output values for providing to an audio power output circuit according to a result of the removing, whereby the audio power output circuit does not expend power reproducing portions of the audio information that would not be perceived by the listener.

24. An integrated circuit, comprising:
an input for an audio source providing audio information;
an audio power output circuit for providing current to a micro-speaker according to the audio information, wherein the micro-speaker has a resonant frequency such that substantial content of the audio information lies below the resonant frequency; and
a processing subsystem that receives the audio information and generates an output signal provided to an input of the audio power output circuit, wherein the processing subsystem filters the audio information with an estimated response simulating a frequency response of the micro-speaker and an acoustic path from the micro-speaker to a listener, and compares the filtered audio information with a frequency-dependent threshold of hearing, and removes portions of the audio information that have an amplitude below the frequency-dependent threshold of hearing, whereby the audio power output circuit does not expend power reproducing portions of the audio information that would not be perceived by the listener.

25. The integrated circuit of claim 24, wherein the input for an audio source is an internal input that receives audio information generated within the integrated circuit.

26. The integrated circuit of claim 24, wherein the processing subsystem comprises:
a microcontroller core; and
a memory, the memory storing program instructions for reducing power consumed in providing an acoustic output from a micro-speaker, the program instructions comprising program instructions for receiving audio information, filtering the audio information with an estimated response simulating a frequency response of the micro-speaker and an acoustic path from the micro-speaker to a listener, comparing the filtered audio information with a frequency-dependent threshold of hearing, removing portions of the audio information that have an amplitude below the frequency-dependent threshold of hearing, and generating output values for providing to the audio power output circuit according to a result of the removing, whereby the audio power output circuit does not expend power reproducing portions of the audio information that would not be perceived by the listener.

* * * * *

UNITED STATES PATENT AND TRADEMARK OFFICE
CERTIFICATE OF CORRECTION

PATENT NO. : 11,153,682 B1  
APPLICATION NO. : 17/025960  
DATED : October 19, 2021  
INVENTOR(S) : Li et al.

It is certified that error appears in the above-identified patent and that said Letters Patent is hereby corrected as shown below:

On the Title Page

On Page 2, Item (56), under "OTHER PUBLICATIONS", in Column 2, Line 5, delete "Adaptve" and insert -- Adaptive --, therefor.

In the Drawings

In Fig. 6, Sheet 5 of 7, delete " 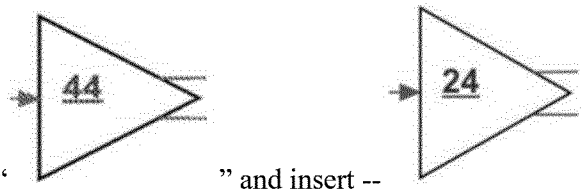 " and insert -- --, therefor.

In Fig. 7, Sheet 6 of 7, delete " 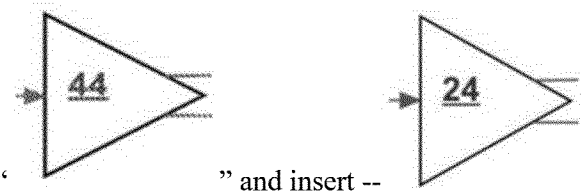 " and insert -- --, therefor.

In the Specification

In Column 4, Line 57, delete "provided a" and insert -- provided to a --, therefor.

In Column 6, Line 33, delete "stage 44," and insert -- stage 24, --, therefor.

Signed and Sealed this  
Fifteenth Day of February, 2022

Drew Hirshfeld  
*Performing the Functions and Duties of the*  
*Under Secretary of Commerce for Intellectual Property and*  
*Director of the United States Patent and Trademark Office*